United States Patent [19]
Holden

[11] Patent Number: 5,297,213
[45] Date of Patent: Mar. 22, 1994

[54] SYSTEM AND METHOD FOR REDUCING NOISE

[76] Inventor: Thomas W. Holden, 507 S. Washington St., Beverly Hills, Fla. 32665

[21] Appl. No.: 863,001

[22] Filed: Apr. 6, 1992

[51] Int. Cl.⁵ .............................................. H04B 15/00
[52] U.S. Cl. ....................................... 381/94; 381/110
[58] Field of Search .................................. 381/94, 110

[56] References Cited

U.S. PATENT DOCUMENTS

| | | | |
|---|---|---|---|
| 4,461,025 | 7/1984 | Franklin | 381/94 |
| 4,703,507 | 10/1987 | Holden | 381/94 |
| 4,809,337 | 2/1989 | Scholz et al. | 381/94 |
| 5,036,540 | 7/1991 | Eastmond | 381/94 |

*Primary Examiner*—Forester W. Isen
*Attorney, Agent, or Firm*—Allen, Dyer, Doppelt, Franjola & Milbrath

[57] ABSTRACT

A noise reduction system for removing unwanted audio noise during a pause. The system receives an intelligence plus noise signal that is split and fed to a first rectifier having a first polarity, and through a filter to a second rectifier having a polarity opposite to the first rectifier. The filter removes components below a frequency where most energy-frequency is distributed in human speech. The output of the rectifiers is summed to produce an output signal when most audio noise between pauses in voice is reduced.

15 Claims, 4 Drawing Sheets

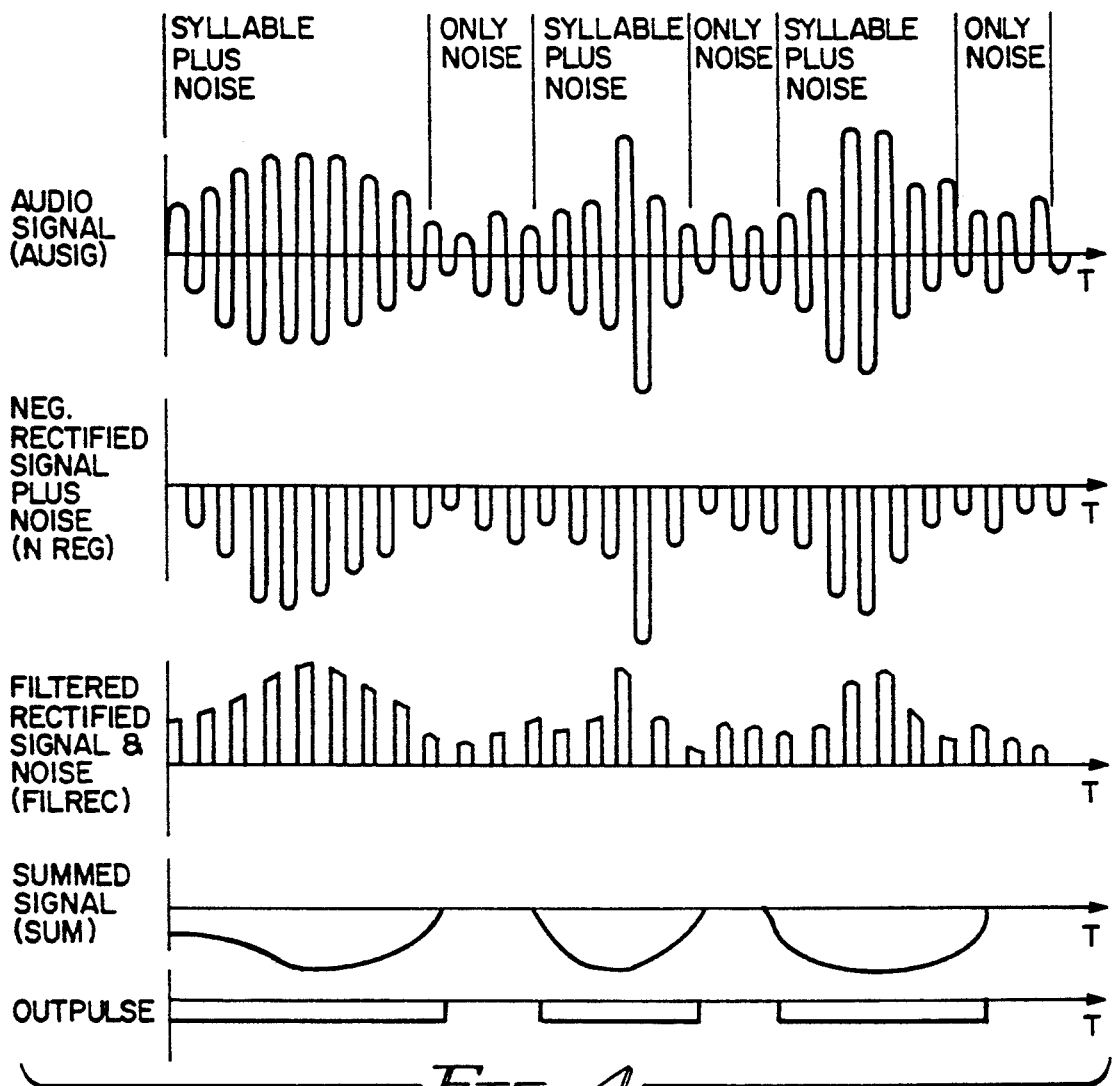
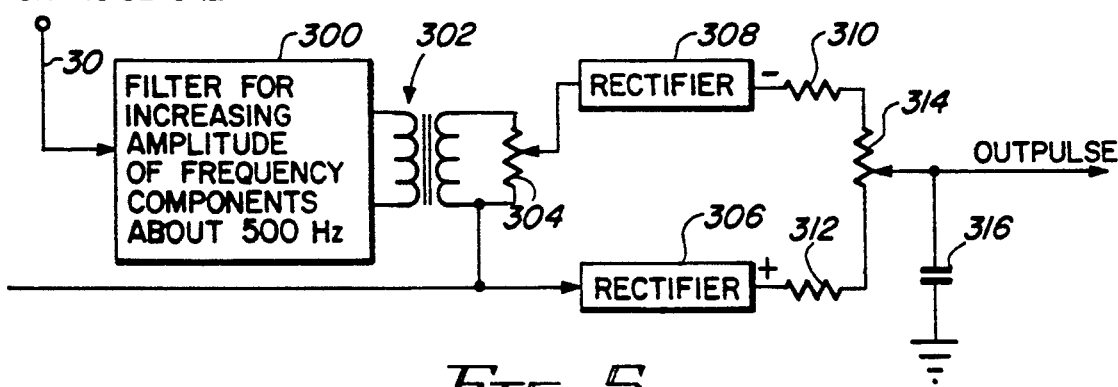

SYSTEM AND METHOD FOR REDUCING NOISE

BACKGROUND OF THE INVENTION

This invention relates to a method and apparatus for reducing noise in electronic devices that receive or amplify signals, and more specifically, for reducing noise during pauses from an electronic device providing a human voice or other information.

Devices for reducing noise levels are generally known. One such device is disclosed in U.S. Pat. No. 4,703,507. This device includes a circuit that reduces noise during pauses in human voice. Included with this device is a detector that senses a syllable envelope within the audio signal. In response to the sensed audio signal, a DC balance control circuit in the device passes a DC signal to a differential amplifier. The amplifier controls the noise in the audio signal with a DC control.

However, as the noise level at the device's input changes, the DC balance control circuit must be readjusted to cancel the noise. When the noise level changes every two to three seconds, it is not possible to keep the DC balance control level adjusted.

A further drawback to this prior device is that noise may have the same general envelope shape as the syllable. When this noise is received, it will pass directly through the filter causing the noise to appear at the output of the device.

SUMMARY OF THE INVENTION

It is an object of this invention to provide an improved method for eliminating noise between pauses of syllables in human voice.

Another object of this device is to reduce noise level in human voice signals without requiring constant readjusting of the device as the level and duration of the noise changes.

It is also an object of this device to eliminate noise in signals irrespective of the shape of the envelope in which the noise in the signal is being provided to the device.

Although the invention has been discussed with reference to audio signals, it will be noted that the invention is equally applicable to higher frequency signals carrying intelligence bearing signals. For example, the invention will operate at the estimated frequencies of a superheterodyne receiver.

These and other objects are accomplished with a method and apparatus for eliminating noises between pauses. Audio voice signals have greater energy at their lower frequency than their higher frequency. The energy within an audio voice signal is not uniform throughout the spectrum. However, noise is uniform in energy throughout the spectrum. Noise is reduced with a device that filters out all signals having a frequency less than a predetermined frequency where energy in human voice increases. The noise reduced signal is rectified and provided to a low pass filter that eliminates the audio portion of the signal and provides a signal that corresponds to the syllable of the voice. This signal, which is a pulse having a duration corresponding to the duration of the voice pulse, is provided to a switch which allows voice to pass when the pulse indicates a voice syllable is present and prevents any noise from being passed when the voice syllable is not being provided.

BRIEF DESCRIPTION OF THE DRAWINGS

FIG. 4 is a timing diagram and waveform diagram of audio signals and noise-only signals at different output components in FIG. 1; and FIG. 5, is a block diagram of an alternate embodiment of the system for reducing noise between pauses.

DESCRIPTION OF THE PREFERRED EMBODIMENTS

Figure 1:
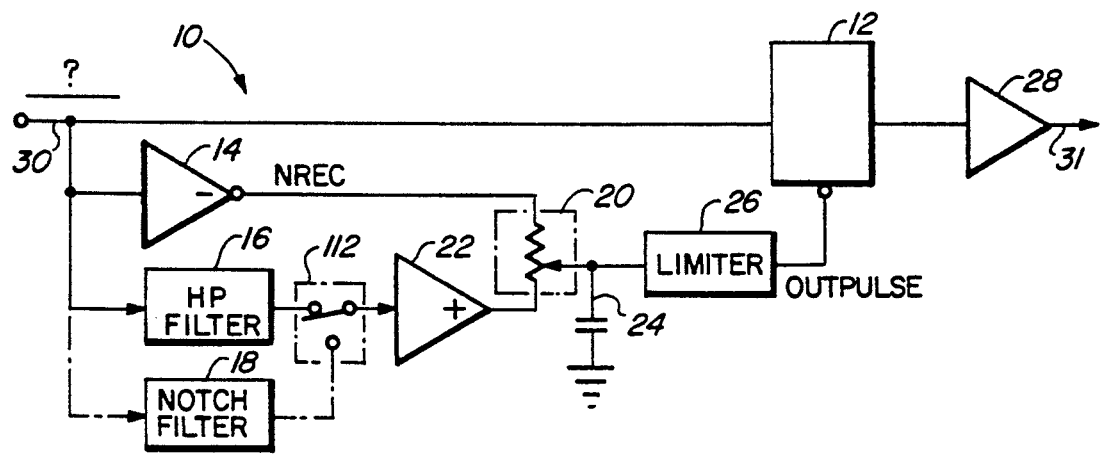
FIG. 1 is a block diagram of the system for reducing noise between pauses.

Referring to FIG. 1 there is shown a block diagram for the noise reduction system generally referred to by number 10. The noise reduction system 10 is fed an audio signal (AUSIG) that is passed to the input of switch 12, negative rectifier 14 and either high pass filter 16 or notch filter 18. This AUSIG contains a noise only component and an intelligent component, such as voice, or AUSIG will contain a noise only component. Negative rectifier 14 inverts and rectifies the AUSIG signal and feeds this negative rectified signal (NREC) to summing circuit 20. High pass filter 16 responds to the AUSIG by filtering or reducing frequencies within the audio signal below a predetermined frequency and passing this positive filtered rectified signal to summing circuit 20. Preferably, this frequency is about 500 Hz and is selected in accordance with the energy of a syllable produced by a speaker. More details of this filter frequency will be discussed later.

AUSIG may be fed to notch filter 18 rather than high pass filter 16. Notch filter 18 is used when the audio signal contains information signals at selected frequencies. The notch filter will reject only a band of the information signal at the selected frequency. The filters 16 or 18 feed the filtered audio signal to positive rectifier 22. Positive rectifier 22 responds to the filtered signal by rectifying the filtered signal and providing a filtered rectified signal (FILREC) to summing circuit 20.

Summing circuit 20 combines NREC with FILREC. The resistance of summing circuit 20 and capacitor 24 provide a filter for cancelling noise envelopes while allowing syllable envelopes to pass as SUM to optional amplitude limiter 26. When a syllable is present at AUSIG, filter 16 removes a much larger proportion of voice energy than noise energy. Therefore, summing circuit 20 is not in a state of balance for voice, and syllable envelopes will appear across capacitor 24. With only noise present at input terminal 30, the arm of summing circuit 20 is adjusted for near zero noise across capacitor 24.

SUM is also filtered by low pass filter 24 to remove audio components (frequency components above 30 Hz). Limiter 26 provides an output pulse (OUTPULSE) to the select terminal of switch 12 having a duration of a typical syllable of a human voice. The duration of the time between output pulses corresponds to the time when a syllable within the audio signal is not present.

Limiter 26 reduces the amplitude of the OUTPULSE to prevent amplitude distortion in switch 12. Limiter 26 may be eliminated and the amplitude distortion of a filtered audio signal (FAUSIG) may be corrected later in circuit 10. Switch 12 responds to OUTPULSE and AUSIG 24 by feeding an audio signal (FAUSIG) through amplifier 28 to output terminal 31. When there are no output pulses (OUTPULSE) being provided on the input terminal of switch 12, AUSIG audio signal is prevented by switch 12 from passing to input terminal 30. An amplifier 28 is provided to boost the FAUSIG being fed to input terminal 30.

Figure 2:
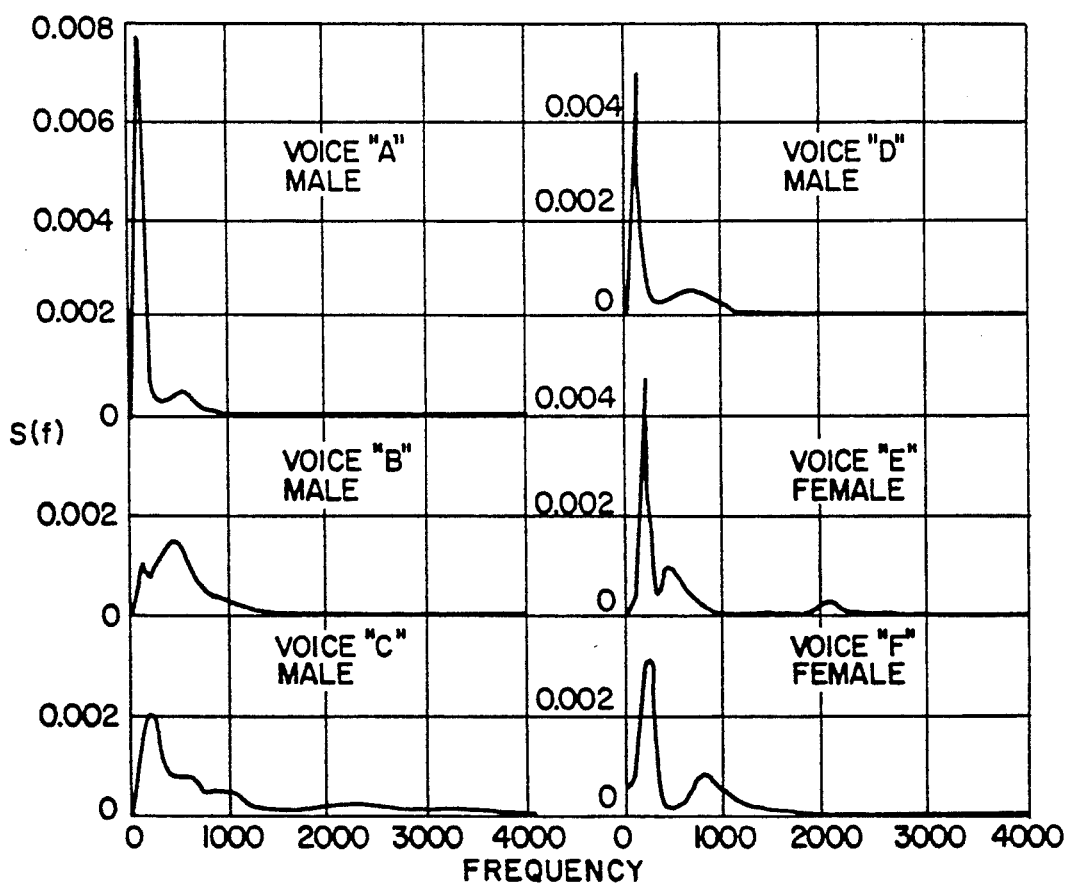
FIG. 2 is a plot showing energy as a function of voice frequencies.

Referring to FIG. 2, there is shown an analysis of individual voices produced by typical speakers. This analysis appeared in *The Physics Review* on page 227 in Mar., 1922. It should be noted that major energy components of the male and female voice are below approximately 500 Hz. It should also be noted that voice energy is concentrated in a predetermined frequency range.

Figure 3A:
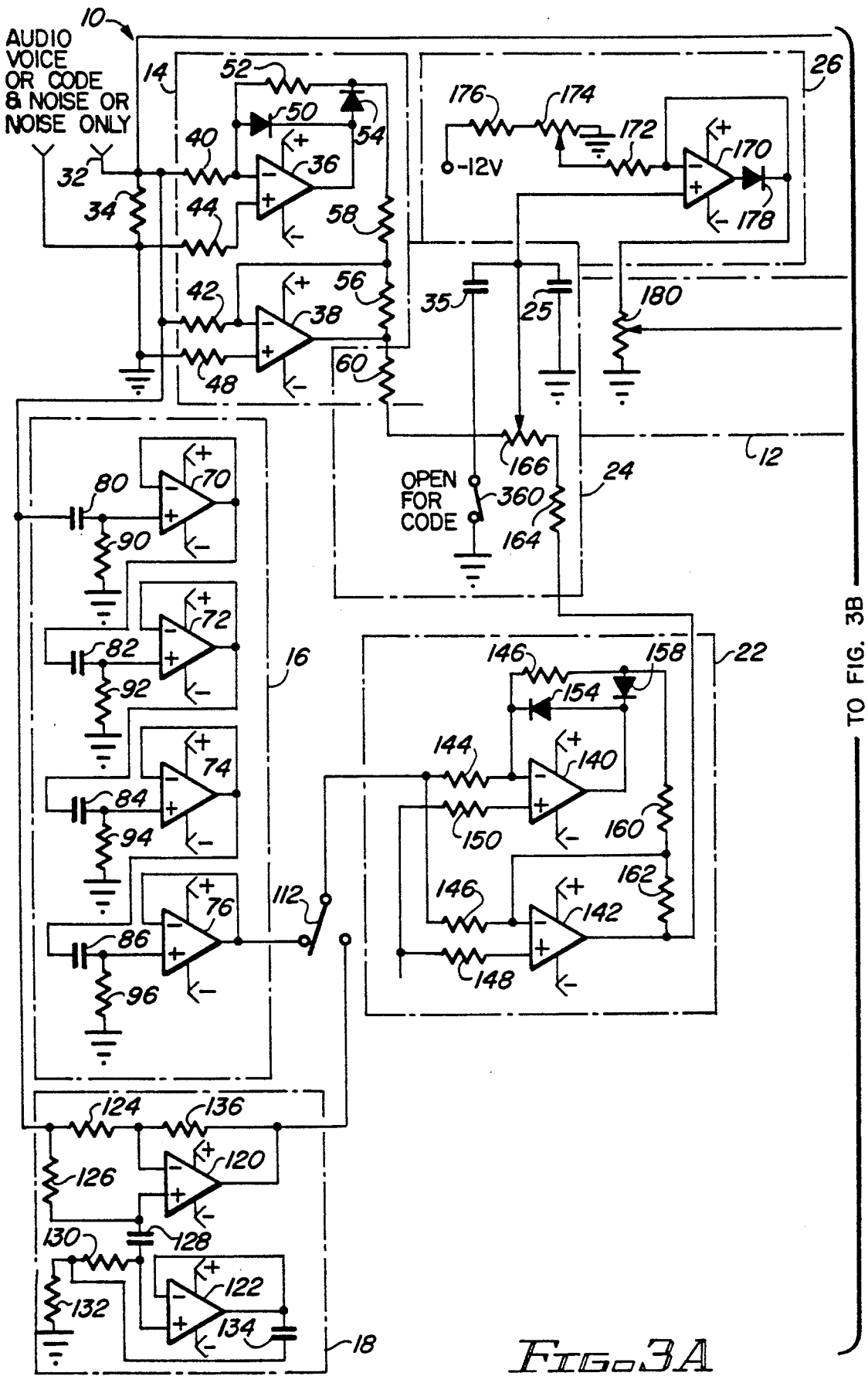
FIGS. 3A and 3B are a schematic diagram detailing the block diagram shown in FIG. 1.
Figure 3B:
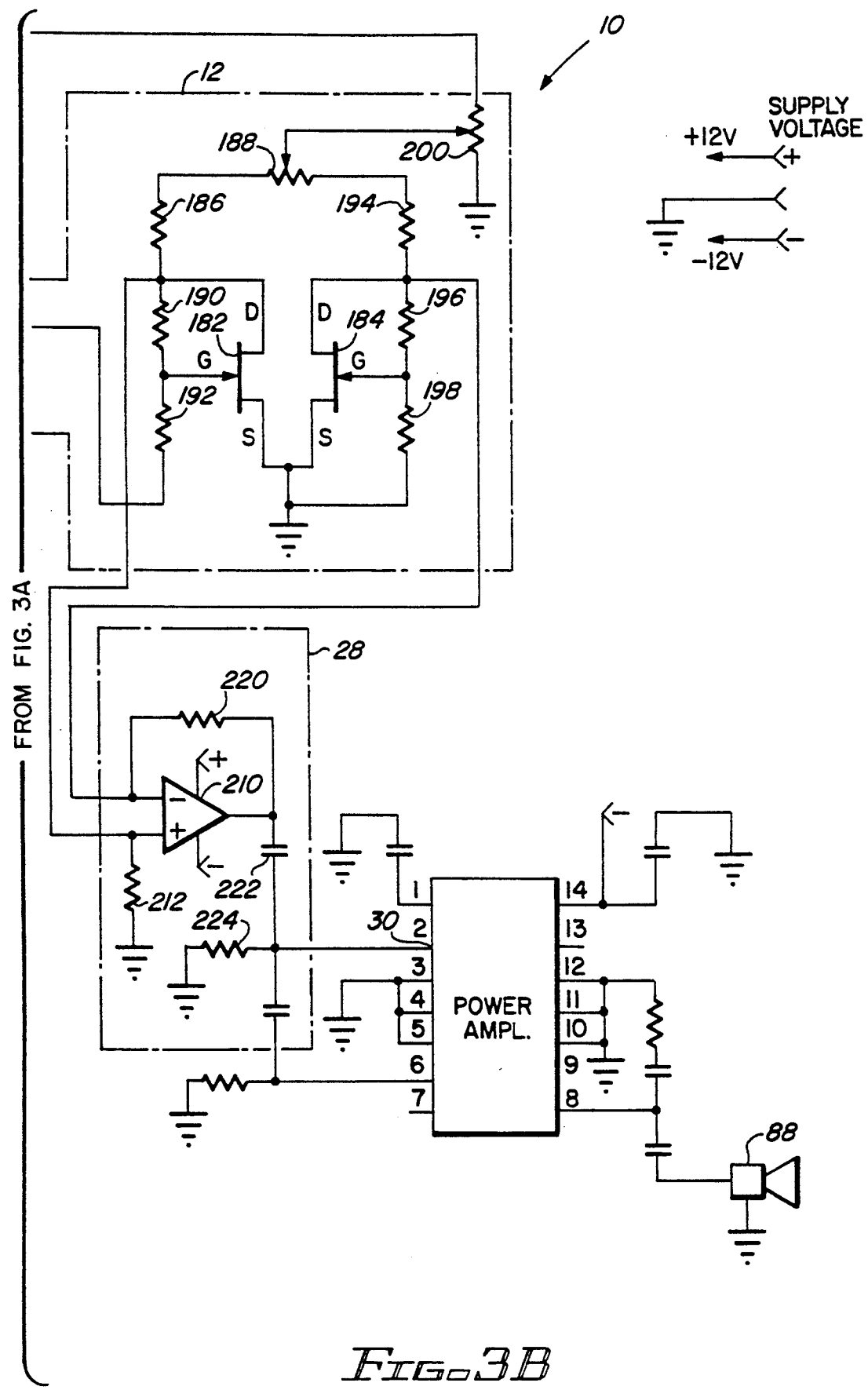

Referring to FIG. 3 there is shown a detailed schematic for the block diagram shown in FIG. 1. This system 10 includes negative rectifier 14 coupled to audio input terminal 32. Coupled between audio input terminal 32 and ground is a termination resistor 34 to provide matching impedance from the AUSIG being fed to terminal 32.

Negative rectifier 14 includes two amplifiers 36 and 38 coupled to input terminal 32 through resistors 40 and 42 respectively. Positive terminals of amplifiers 36 and 38 respectively are coupled through termination resistors 44 and 48 to ground. Coupled between the output terminal and the negative input terminal of amplifier 36 are diode 50, resistor 52 and diode 54. Resistor 56 is coupled between the output terminal and the negative input terminal of amplifier 38. The output terminal of 36 is coupled through diode 54, resistor 58 and resistor 56 to the output terminal of negative rectifier 14. The output terminal of 38 is coupled to the output terminal 62 of negative rectifier 14 through resistor 60. Negative rectifier 14, using amplifiers 36 and 38, inverts and rectifies AUSIG on input terminal 32 and feeds this negative rectified (NREC) (see FIG. 4) signal through output terminal 62 to summing circuit 20.

Also coupled to input terminal 32 is high pass filter 16 which is comprised of a plurality of differential amplifiers 70-76. Each of these amplifiers 70-76 has their output terminal coupled to their negative input terminal. Also, the positive input terminal of amplifier 70 is coupled through capacitor 80 to input terminal 32. The output terminals of amplifiers 70-74 are coupled through capacitors 82-86 to the positive input terminals of amplifiers 72-76 respectively. The positive input terminals of amplifiers 70-76 are each coupled through a respective resistor 90-96 to ground. Filter 16 reduces frequency components in AUSIG that are less than about 500 Hz. As shown in FIG. 2, frequencies less than about 500 Hz contain most of the energy distribution in human voice.

The output of filter 16 is fed through a switch 112 which selects whether the output of notch filter 18 or the output of high pass filter 16 is to be fed to rectifier 22.

When signals containing information other than voice such as frequency codes are to be filtered, a notch filter 18 is substituted for filter 16. This filter will reject all frequencies in the notch range. When frequency codes are to be filtered, switch 36 is open and switch 112 is selected to the code position. Notch filter 18 includes amplifiers 120 and 122 with the negative input terminal of 120 being coupled through resistor 124 through input terminal 32 and the positive input terminal of amplifier 120 being coupled in series through resistor 126, input terminal 32 and capacitor 128 to the positive input terminal of amplifier 122. The positive input terminal of amplifier 122 is also coupled through resistors 130 and 132 to ground. The bias point between resistors is 130 and 132 is coupled through capacitor 134 to the positive output terminal and negative input terminal of amplifier 122. The negative input terminal of amplifier 120 is coupled through resistor 136 to output terminal of amplifier 120. The output terminal of amplifier 120 is directly coupled to switch 112. This configuration of notch filter 18 rejects signals having a range between 400 and 700 Hz. The desired frequency of the code is in the notch range.

Switch 112 is coupled to rectifier 22 that includes amplifier 140 and 142. Switch 112 is coupled to the negative input terminal of amplifiers 140 and 142 through resistors 144 and 146 respectively. The positive input terminals of amplifiers 140 and 142 are coupled through resistors 148 and 150 to ground. The negative input terminal of amplifier 140 is coupled through diode 154 and, in series, through resistor 146 and diode 158, the output terminal of amplifier 140. Coupled between resistor 156 and diode 158 is resistor 160 which biases the output signal from amplifier 140. The negative terminal of amplifier 142 is coupled through resistor 162 to the output terminal of amplifier 142. The output signal from amplifiers 140 and 142 are combined as FILREC (FIG. 4) and fed through resistor 164 to summing circuit 20. It can be seen from FIG. 4 that the output of rectifier 22 (FILREC) is a rectified and filtered signal with AUSIG components below a predetermined frequency reduced in amplitude by filter 16.

The outputs from rectifier 14 as well rectifier 22 are combined with summing circuit 20 to produce a SUM signal. Summing circuit 20 includes variable resistor 166. When no AUSIG is provided on terminal 32, the voltage level with respect to ground, at the arm of resistor 166 should be zero or slightly negative. When the noise component of AUSIG is present, the arm of resistor 166 should be adjusted until the noise level, with respect to ground at the arm of resistor 166, is near zero.

The arm of variable resistor 166 is coupled through capacitor or low pass filter 24 to ground as well as to the positive input terminal of amplifier 170 within limiter 26. Resistors 60, 166, 164 With capacitor 25 comprise a filter for removing the audio components of signals (NREC and FILREC) from rectifiers 14 and 22. This filter circuitry passes the syllable envelope and cancels the noise envelope of AUSIG. Filter 24 preferably removes frequency components above 50 Hz in the SUM signal.

Limiter 26 prevents excessive expansion of the AUSIG. The output (SUM) from limiter 26 is used to control the gain circuit within switch 12.

Amplifier 170 within limiter 26 is coupled through resistor 172 to the arm of variable resistor 174. One terminal of resistor 174 is coupled through resistor 176 to −12 volts and the other terminal of variable resistor 174 is coupled to ground. Variable resistor 174 is set to adjust the limiting threshold that triggers differential amplifier 170. The negative terminal of differential amplifier 170 is coupled through diode 178 to the output terminal of amplifier 170. Amplifier 170 limits the pulse signal from summing circuitry 20, filter 24 and then feeds the signal to variable resistor 180 which is coupled at another terminal to ground. The arm of variable resistor 180 should be adjusted such that the maximum voltage change on the arm of resistor 180 enough to produce a quality signal from loudspeaker 88. A typical output pulse (OUTPULSE) fed from limiter 26 to switch 12 is shown in FIG. 4.

Switch 12 includes one monolithic dual n-channel JFET transistors 182 and 184 connected as a voltage control resistor. The source terminal of transistors 182 and 184 is coupled to ground. The gate terminal of transistor 182 is coupled through resistor 186 to variable resistor 188 and in series through resistors 190 and 192 to variable resistor 180. The gate of transistor 182 is biased by the voltage level between resistors 190 and 192.

The drain of transistor 184 is coupled through resistor 194 to variable resistor 188 and through resistors 196 and 198 to ground. The gate of transistor 184 is biased by the voltage level between resistors 196 and 198.

OUTPULSE from limiter 26 controls the balance of switch 12. Resistors 190, 192, 196 and 198 are used to make transistors 182 and 184 linear. Transistors' 182 and 184 output (FAUSIG) is connected to amplifier 28.

The arm of variable resistor 188 is coupled to the arm of variable resistor 200. The voltage across variable resistor 200 is set by the amplitude of AUSIG. Variable resistor 188 is adjusted for minimum noise and the arm of resistor 200 is adjusted to prevent overload of transistors 182 and 184.

Referring to FIGS. 1 and 4, AUSIG is the typical signal on the input to switch 12. The other input from limiter 26 is shown on FIG. 4 as OUTPULSE. Switch 12 responds to OUTPULSE by passing the audio signal portion of the AUSIG to amplifier 28.

Amplifier 28 boosts the FAUSIG from switch 12. Amplifier 28 includes a differential amplifier 210 having its negative terminal biased by resistors 194 and 196, and having positive terminal biased by resistors 190 and 186. The positive terminal of amplifier 210 is coupled through resistor 212 to ground. The negative terminal of differential amplifier 210 is coupled through resistor 220 to the output terminal of amplifier 210. The output terminal of amplifier 210 is coupled through capacitor 222 to input terminal 30 and through resistor 224 to ground. Though a typical amplifier is shown, other amplifiers may be easily substituted to amplify the signal from switch 12. Circuits constructed in accordance with FIG. 3 operate quite well with the following component values.

| COMPONENT | | VALUE |
| --- | --- | --- |
| Resistors: | 52, 40, 56, 42, 156, 144, 162, 146 | 20k |
| | 58, 160, 224, 176, 172 | 10k |
| | 44, 150 | 15k |
| | 148, 152 | 6.2k |
| | 90, 92, 94, 96 | 5.6k |
| | 174 | 250 ohms |
| | 124, 136 | 500k |
| | 126 | 250k |
| | 130, 132 | 69k |
| | 166 | 50k |
| | 184, 200 | 5k |
| | 212, 220 | 27k |
| | 190, 192, 196, 198 | 1 megohm |
| | 186, 194 | 470 ohms |
| | 188, 34 | 50 ohms |
| Capacitors: | 25, 35 | .47 microfarads |
| | 80, 82, 84, 86 | .1 microfarads |
| | 128 | 82 picrofarads |
| | 222 | .2 microfarads |
| Transistor: | 182 | Signetics #404 monolithic |

| -continued | | |
| --- | --- | --- |
| IC | 36, 38, 140, 142, 120, 122 | n-channel JFET 1458n |
| | 170 | 741 op amp |
| | 210 | Signetics #5534 single low noise op amp. |
| Diodes: | 50, 54, 154, 158 | 1N4148 switching diode |

Referring to FIG. 5, there is shown an alternate embodiment of the filter and rectifier circuit of FIG. 1 which includes filter 300 connected to input 30. Filter 300 increases the amplitudes of frequency components in AUSIG below about 500 Hz of voice and noise, or noise only. The output of filter 300 is fed through a transformer 302 and variable resistor 304 to rectifier 308 that negatively rectifies the output of the filter 300. Input 30 is connected to rectifier 306 which positively rectifies AUSIG.

The output of rectifiers 308 and 306 are fed through respective resistors 310 and 312 to variable resistor 314. The output of variable resistor 314 is coupled to shunt capacitor 316 and provides a DC output pulse (OUTPULSE) which is fed to switch 12. The OUTPULSE will occur when a value component is present on AUSIG. Switch 12 and amplifier 28 respond to OUTPULSE and AUSIG as previously described in connection with FIG. 1.

This concludes the description of the preferred embodiment. A reading by those skilled in the art will bring to mind various changes without departing from the spirit and scope of the invention. It is intended, however, that the invention only be limited by the following appended claims.

What is claimed is:

1. A method for reducing noise between pauses in audio communication having an energy distribution, the method comprising the steps of:
   providing an audio signal having an intelligence plus noise component and a noise only component;
   determining a frequency value below which most of the energy distribution in the audio communication occurs;
   filtering and increasing the amplitude of a portion of the audio signal having a frequency less than the frequency value determined;
   rectifying the filtered audio signal;
   rectifying the audio signal with a polarity opposite to the polarity of the rectified filtered audio signal and combining the rectified filtered audio signal with the rectified audio signal to produce an intelligence syllable signal; and
   passing the intelligence component plus noise of the audio signal in response to the intelligence syllable signal.

2. A system for reducing noise in an audio signal during pauses between the audio signals, syllables, the system comprising:
   means for rectifying the audio signal to provide a negative rectified signal;
   means for filtering the audio signal to remove frequency components in said audio signal below a predetermined threshold to provide a filtered audio signal;
   means for rectifying the filtered audio signal to provide a positive rectified signal with frequency components above the predetermined threshold;

means for combining the negative rectified signal with the positive rectified signal to provide a combined signal, and for filtering frequency components of the signal greater than a second predetermined frequency to provide a plurality of output pulses which each pulse having a duration corresponding to the duration of audio signal syllables; and means for passing the audio signal in response to said pulse output, and for preventing the passage of the audio signal between output pulses.

3. The apparatus as recited in claim 2 wherein said first predetermined frequency is about 500 Hz.

4. The apparatus as recited in claim 2 wherein said second predetermined frequency is about 30-50 Hz.

5. A system for reducing noise in audio signals during pauses between intelligent signal syllables, the system comprising:

means responsive to the audio signals for providing a pulse having a duration corresponding to the duration of an audio signal syllable, the pulse providing means including means for filtering frequency components above a frequency corresponding to audio frequencies where most of the energy is distributed in human voice to provide a SUM signal, the pulse providing means further including a filter means for amplifying signals having a frequency less than a predetermined value, a rectifier means for rectifying the amplified signal and for rectifying the audio signals, and means for summing the rectified signals to provide the pulse; and means responsive to the pulse for passing audio signals for the duration of the syllable and for preventing the passage of noise between audio signal syllables.

6. A system for reducing noise between voice syllables in audio communications comprising:

a signal input for receiving an intelligence plus noise signal or a noise only signal;

filter means connected to said signal input for reducing the amplitude of intelligent plus noise signals and noise only signals that have a frequency less than a predetermined value;

first rectifier means connected to said signal input and having an output for rectifying in a first polarity the intelligence signal plus noise and the noise only signal;

second rectifier means connected to said filter and having an output for rectifying the amplitude reduced intelligence signal plus noise and amplitude reduced noise only signal with a polarity opposite the first polarity;

means for summing said first rectifier means output with said second rectifier means output to produce a pulse output signal; and means connected to said signal input and responsive to said pulse output signal for preventing passage of said noise only signal while passing the intelligent signal plus noise.

7. The system as recited in claim 6 wherein said predetermined frequency is between 400 and 700 Hz.

8. The system as recited in claim 7 further comprising filter means coupled to said summing means for filtering output signals having a frequency above a second predetermined value.

9. The system as recited in claim 6 further comprising means coupled between said summing means and said preventing means for limiting the amplitude of said pulse output to prevent said preventing means from saturating.

10. The system as recited in claim 7 wherein said summing means further comprises second filter means for filtering voice components in said pulsed output signal.

11. The system as recited in claim 8 wherein said second filter means filter frequencies in signals above about 50 Hz.

12. The system as recited in claim 6 wherein the first rectifier means negatively rectifies the intelligence plus noise and the noise only signal; and wherein the second rectifier means positively rectifies the amplitude reduced intelligence signal plus noise and the amplitude reduced noise only signal.

13. A method for reducing noise between pauses in audio communication, the method comprising the steps of:

providing an audio signal having an intelligence plus noise component and a noise only component;

filtering the amplitude of a portion of the audio signal having a frequency less than a predetermined value;

rectifying the filtered audio signal;

rectifying the audio signal with a polarity opposite to the polarity of the filtered audio signal combining the rectified filtered audio signal with the rectified audio signal to produce an intelligence syllable signal; and passing the intelligence component plus noise of the audio signal in response to the intelligence syllable signal.

14. The method as recited in claim 13 further comprising the steps of filtering the intelligence syllable signal to produce a series of pulses each having a duration corresponding to the duration of the syllable signal; passing the intelligence component for the duration of said pulse; and preventing the passage of the noise only component of the audio signal between pulses.

15. The method as recited in claim 13 further comprising the steps of increasing the amplitude of the portion of the audio signal having a frequency less than the predetermined noise when filtering.

* * * * *